United States Patent
Kaiser et al.

(10) Patent No.: US 11,222,992 B2
(45) Date of Patent: Jan. 11, 2022

(54) OPTOELECTRONIC COMPONENT AND METHOD FOR THE PRODUCTION THEREOF

(71) Applicant: OSRAM OPTO SEMICONDUCTORS GMBH, Regensburg (DE)

(72) Inventors: Stephan Kaiser, Regensburg (DE); Andreas Ploessl, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/041,343

(22) Filed: Jul. 20, 2018

(65) Prior Publication Data

US 2018/0331254 A1  Nov. 15, 2018

Related U.S. Application Data

(62) Division of application No. 12/996,622, filed as application No. PCT/DE2009/000781 on Jun. 3, 2009, now Pat. No. 10,128,405.

(30) Foreign Application Priority Data

Jun. 6, 2008 (DE) .................... 10 2008 027 041.5
Oct. 6, 2008 (DE) .................... 10 2008 050 538.2

(51) Int. Cl.
*H01L 33/00* (2010.01)
*H01L 33/20* (2010.01)
*H01L 33/40* (2010.01)

(52) U.S. Cl.
CPC .......... *H01L 33/0093* (2020.05); *H01L 33/20* (2013.01); *H01L 33/405* (2013.01); *H01L 2924/0002* (2013.01)

(58) Field of Classification Search
CPC .................. H01L 33/20; H01L 33/405; H01L 2924/0002
See application file for complete search history.

(56) References Cited

U.S. PATENT DOCUMENTS 5,291,574 A  3/1994  Levenson
6,111,272 A  8/2000  Heinen
(Continued)

FOREIGN PATENT DOCUMENTS

CN  1592974  3/2005
CN  1957481  5/2007
(Continued)

OTHER PUBLICATIONS

I. Schnitzer et al., "30% external quantum efficiency from surface textured, thin-film light-emitting diodes", Appl. Phys. Lett. 63, No. 16, pp. 2174-2176, Oct. 18, 1993.
(Continued)

*Primary Examiner* — Steven B Gauthier
*Assistant Examiner* — Christopher A Culbert
(74) *Attorney, Agent, or Firm* — Cozen O'Connor

(57) ABSTRACT

An optoelectronic component, comprising: a structured semiconductor layer, a metallic mirror layer arranged on the semiconductor layer, a diffusion barrier layer arranged on the metallic mirror layer, a passivation layer arranged on the diffusion barrier layer, wherein the semiconductor layer comprises a mesa structure with mesa trenches. The mesa trenches taper from the surface of the semiconductor layer towards the mirror layer.

10 Claims, 15 Drawing Sheets

(56) References Cited

U.S. PATENT DOCUMENTS

| | | | |
|---|---|---|---|
| 6,537,870 | B1 | 3/2003 | Shen |
| 7,129,528 | B2 | 10/2006 | Bader et al. |
| 7,724,224 | B2 | 5/2010 | Kwon et al. |
| 2002/0017652 | A1 | 2/2002 | Illek et al. |
| 2002/0057645 | A1 | 5/2002 | Kishima |
| 2003/0038344 | A1* | 2/2003 | Palmer .............. H01L 21/76898 257/621 |
| 2003/0111667 | A1 | 6/2003 | Schubert |
| 2004/0104390 | A1* | 6/2004 | Sano ...................... B82Y 20/00 257/78 |
| 2004/0113167 | A1 | 6/2004 | Bader et al. |
| 2006/0060872 | A1* | 3/2006 | Edmond .............. H01L 33/007 257/94 |
| 2006/0105542 | A1 | 5/2006 | Yoo |
| 2006/0186418 | A1* | 8/2006 | Edmond ............. H01L 33/0079 257/79 |
| 2006/0023774 | A1 | 10/2006 | Baur et al. |
| 2007/0023774 | A1 | 2/2007 | Wirth et al. |
| 2008/0116472 | A1 | 5/2008 | Tsunoda |
| 2008/0142780 | A1 | 6/2008 | Bader et al. |
| 2008/0164571 | A1 | 7/2008 | Kelly et al. |
| 2008/0290356 | A1 | 11/2008 | Ploessl et al. |
| 2009/0101919 | A1 | 4/2009 | Yao |
| 2010/0224892 | A1* | 9/2010 | Nakahara ................ H01L 33/10 257/98 |

FOREIGN PATENT DOCUMENTS

| | | |
|---|---|---|
| CN | 1977395 | 6/2007 |
| DE | 196 40 594 | 4/1998 |
| DE | 102 45 628 | 4/2004 |
| DE | 103 40 271 | 4/2005 |
| DE | 10 2005 016 592 | 11/2005 |
| DE | 10 2005 033 005 | 1/2007 |
| EP | 0 905 797 | 8/1998 |
| JP | 2005-012188 | 1/2005 |
| JP | 2005-064426 | 3/2005 |
| JP | 2006-190854 | 7/2006 |
| JP | 2006-269807 | 10/2006 |
| JP | 2007-200995 | 8/2007 |
| JP | 2007200995 A * | 8/2007 ............ H01L 33/10 |
| JP | 2008-130799 | 6/2008 |
| KR | 2004-0087122 | 10/2004 |
| KR | 10-2005-0087122 | 8/2005 |
| KR | 2007-0085374 | 8/2007 |
| WO | WO 02/13281 | 2/2002 |
| WO | WO 2007/089460 | 8/2007 |
| WO | WO 2007/136392 | 11/2007 |
| WO | WO 2008/040315 | 4/2008 |

OTHER PUBLICATIONS

D. Zhuang et al., "Wet etching of GaN, AlN and SiC: a review", Materials Science and Engineering R 48, 2008, pp. 1-46.

English Translation of an Office Action dated Aug. 13, 2013 issued in the corresponding Japanese Patent Application No. 2011-511971.

English translation of an Office Action dated Apr. 1, 2014 issued in the corresponding Japanese Patent Application No. 2011-511971.

English translation of an Office Action dated Dec. 14, 2016 which issued in the corresponding Korean Patent Application No. 10-2011-7000175.

English translation of an Office Action dated Jun. 19, 2017 which issued in the corresponding Korean Patent Application No. 10-2011-7000175.

Decision of Rejection dated Jun. 14, 2018 issued in the corresponding Korean Application No. 10-2011-7000175, with partial English Summary.

D. Zhuang et al., "Wet etching of GaN, AlN and SiC: a review", Materials Science and Engineering R 48, 2005, pp. 1-46.

\* cited by examiner

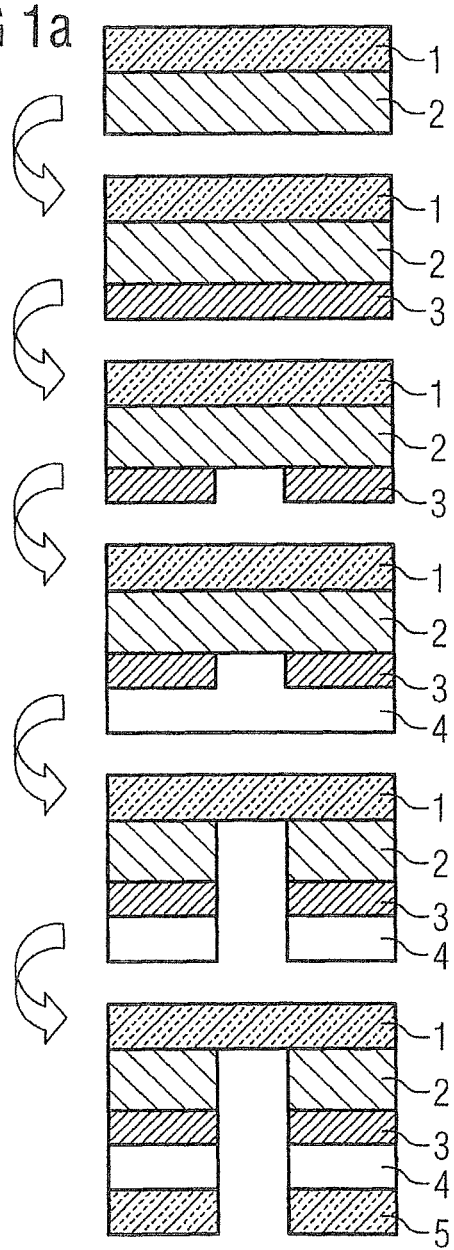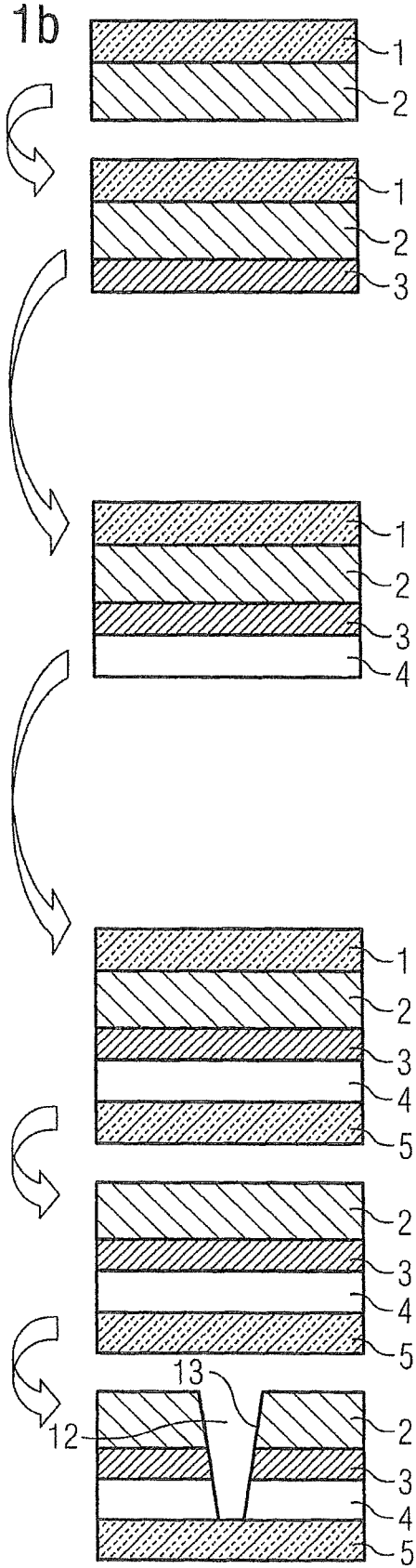

OPTOELECTRONIC COMPONENT AND METHOD FOR THE PRODUCTION THEREOF

RELATED APPLICATIONS

This application is a divisional of U.S. patent application Ser. No. 12/996,622 filed Mar. 17, 2011, which is a U.S. National Stage of International Application No. PCT/DE2009/000781 filed Jun. 3, 2009, which claims priority of German application nos. 10 2008 027 041.5 filed Jun. 6, 2008 and 10 2008 050 538.2 filed Oct. 6, 2008, the entire content of all of which are hereby incorporated by reference.

FIELD OF THE INVENTION

The present invention relates to an optoelectronic component and a method for its production.

BACKGROUND OF THE INVENTION

A widespread problem in the production of optoelectronic components is that, after epitaxial growth of the semiconductor layer on a growth substrate, a plurality of photolithographic steps have to be performed on the p-side, i.e. from the side which is subsequently provided with the p-contact, before the growth substrate is separated from the epitaxial layer for example by laser lift-off (LLO).

In laser lift-off (LLO) the substrate, which is to be detached from the other layers, is irradiated with a pulsed or a non-pulsed laser, which penetrates the substrate. This results in heating of the surface of the semiconductor layer, which adjoins the substrate. When the required temperature is reached the substrate is split off.

A method of separating substrate and semiconductor layer by means of laser lift-off is explained for example in DE 19640594 A1, the disclosure content of which is hereby included in this respect by reference. Method steps prior to the LLO may hereinafter be named as "pre-LLO", and those thereafter as "post-LLO".

In semiconductor manufacturing, the term "mesa" is used to denote a protected region raised after an etching step. The recesses obtained by the etching process are known as "mesa trenches", and the side walls of the mesa trenches as "mesa flanks". Each etching step is usually preceded by a photolithographic step, in which the region which is intended subsequently to form the mesa is protected from the etching chemical by means of a photoresist. To this end, the entire surface is first coated with a photoresist, then a mask is placed onto the resist, and the regions not covered by the mask are exposed to light. As a result of exposure to light, these sub-regions of the resist cure, whereas the unexposed regions may be washed away in the next step. The regions not protected by the cured photoresist can be etched in a further method step.

In a widespread production method, four photolithographic steps have to be performed prior to LLO. One of these includes GaN mesa etching from the p-side, while the n-side is joined to the growth substrate. After detachment of the growth substrate by LLO, a further photolithographic step is generally necessary to form the n-contact structure.

SUMMARY OF THE INVENTION

One object of the present invention is to reduce the number of photolithographic steps and etching steps in the production process compared to conventional methods and thus to reduce the number of process steps.

A further object is avoiding damage to mesa flanks during laser lift-off (LLO).

It should be pointed out at this point that the term "component" refers not only to finished components such as for example light-emitting diodes (LEDs) or laser diodes, but also to substrates and/or semiconductor layers, such that a first component and a second component joined together by for example an adhesive or solder layer form a higher order third component or are part of such a component. During production of a thin-film semiconductor chip, it is for example convenient having two components joined together.

The optoelectronic component may, for example, be a thin-film light-emitting diode chip. A thin-film light-emitting diode chip is distinguished by at least one of the following characteristic features:

- a reflective layer is applied to or formed on a major surface, facing a carrier element, in particular the carrier substrate, of the radiation-generating semiconductor layer sequence, this being in particular a radiation-generating epitaxial layer sequence, said reflective layer reflecting at least some of the electromagnetic radiation generated in the semiconductor layer sequence back into it;
- the thin-film light-emitting diode chip has a carrier element, which is not the growth substrate on which the semiconductor layer sequence was grown epitaxially but a separate carrier element, which was attached afterwards to the semiconductor layer sequence;
- the semiconductor layer sequence has a thickness in the range of 20 µm or less, in particular in the range of 10 µm or less;
- the semiconductor layer sequence is free of a growth substrate. "Free of a growth substrate" here means that, if applicable, a growth substrate used for growth has been removed from the semiconductor layer sequence or at least greatly thinned. In particular it is thinned in such a way that it is not self-supporting either alone or together with the epitaxial layer sequence. The remaining remnant of the greatly thinned growth substrate is unsuited in particular as such to the function of a growth substrate; and
- the semiconductor layer sequence contains at least one semiconductor layer with at least one face which comprises an intermixing structure, which ideally leads to an almost ergodic distribution of the light in the semiconductor layer sequence, that is, it exhibits a scattering behavior which is as ergodically stochastic as possible.

The basic principle of a thin-film light-emitting diode chip is described for example in the document I. Schnitzer et al., Appl. Phys. Lett. 63 (16) 18 Oct. 1993, pages 2174-2176, the disclosure content of which is hereby included in this respect by reference. Examples of thin-film light-emitting diode chips are described in the documents EP 0905797 A2 and WO 02/13281 A1, the disclosure content of which is also hereby included in this respect by reference.

One aspect of the present invention is directed to a method for producing an optoelectronic component that comprises the following method steps: providing a growth substrate as method step A), growing at least one semiconductor layer epitaxially on the growth substrate to produce an operationally active zone as method step B). The method comprises as further method steps the application of a metallic mirror layer on the semiconductor layer as method step C), and the application of at least one contact layer for electrical contacting of the component as method step D). The method moreover comprises detachment of the growth substrate from the semiconductor layer as method step E), wherein a surface of the semiconductor layer is exposed. The semiconductor layer is then structured in method step F) by means of an etching method from the side of the surface which was exposed in method step E).

In a method variant just one etching step and thus also just one photolithographic step is needed to produce the structured layer sequence. This is a clear advantage over the conventional methods. The risks involved in the process may thereby be reduced and the yield increased. Moreover, the entire production process accelerated.

Because the etching in method step F) proceeds from the side of the surface which was exposed in method step E), a positive mesa edge is provided. This means that the mesa trenches formed by the etching process taper towards the other layers when viewed from the surface which was previously joined to the growth substrate, whilst the mesa itself, i.e. for example the semiconductor layer, widens when viewed from the surface. The flanks of the trenches are thus slightly inclined and do not extend perpendicularly to the surface, which is a consequence of the wet etching method. The etching and the associated photo method are not performed until after LLO, the method is therefore a "post-LLO mesa photo method".

Moreover, the positive mesa edge additionally makes slight improvements in light emission possible.

In previous methods, a pre-LLO mesa photo method was performed, which was carried out from the side remote from the substrate. The consequence of this is that the mesa flank is inclined backwards, that is, a negative mesa edge is thus present, a pre-LLO mesa photo method results thus in a mesa edge undercut. This may result in breakage of the tips of the mesa edge having a negative mesa edge with an acute angle, during LLO.

The positive mesa edge additionally has the advantage of displaying greater stability and breaking stability compared to the negative mesa edge at the upper side, which was joined to the growth substrate. This is an advantage for further method steps. Damage to the mesa flanks during LLO cannot arise with the method variants according to the invention, since here, LLO takes place first and etching of the mesa trenches only takes place thereafter.

In a further method according to an embodiment of the invention, the metallic mirror layer is applied to the unstructured semiconductor layer in method step C).

This has the advantage that the mirror layer is located completely on the surface of the semiconductor layer and no material, which would have to be removed again in subsequent method steps, is applied into any existing interspaces. A further advantage is that the semiconductor layer and the mirror layer can be structured together in one etching step. The same also applies to further layers which are to be applied to the mirror layer and likewise to be structured.

In a further embodiment of the method precisely one semiconductor layer is grown in method step B). The optoelectronic component produced in this way thus comprises just one semiconductor layer, which enables the production of very thin components.

A suitable material which may be used for the semiconductor layer grown epitaxially in method step B) is one which comprises a III-V semiconductor material. This III-V semiconductor material is preferably GaN, GaInN or AlN. The semiconductor layer may however also be formed from various materials which may be produced by successive epitaxial growth. The semiconductor layers may for example be undoped or p- or n-doped.

In a further variant of the method according to the invention, the at least one contact layer is applied in method step D) to an unstructured mirror layer. This in turn has the advantage that the material of the contact layer does not have to be applied to structures which have already been produced and thus cannot penetrate into exposed interspaces from which it has to be removed again in further method steps. Here, structuring of the contact layer may also, if necessary, be effected together with structuring of the semiconductor layer and mirror layer.

Separation of the growth substrate from the semiconductor layer in method step E) is preferably effected by means of laser lift-off (LLO).

In a further embodiment of the method, the structuring in method step F) subdivides the semiconductor layer by means of trenches into a plurality of sub-regions. This results in a mesa structure. This means that the trenches produced for example by an etching method penetrate the entire semiconductor layer. Since the trenches are produced by a structuring method, which is applied from the side which was previously joined to the growth substrate, the cross-section of the trenches tapers in the direction of the mirror layer from the surface which was exposed for example by laser lift-off. The semiconductor layer therefore has a positive mesa edge at the flanks. Such a semiconductor layer is distinguished by greater stability compared to a semiconductor layer with negative mesa edge, for example in the following process steps.

A further method according to an embodiment of the invention comprises, in addition to method steps A) to F), the following further method steps: application of a diffusion barrier layer to the mirror layer as method step G), and application of a passivation layer to the diffusion barrier layer as method step H). The layer sequence produced in method steps A) to H) may be applied in a further method step, method step I), to a carrier.

Such a carrier could for example be produced by a method comprising the following method steps: providing a carrier wafer as method step I1), and applying a barrier layer to the carrier wafer as method step I2) and applying a bonding layer to the barrier layer as method step I3).

The bonding layer may join the layer sequence produced in method steps A) to H) to the carrier. An adhesive or a solder material can for example be used for the bonding layer. The carrier serves inter alia in stabilizing the layer sequence for further method steps, especially after detachment of the growth substrate, and for example for subsequent use in the optoelectronic component. The carrier may however also perform tasks such as contacting and current conduction in the component.

A sapphire or Si is preferably used as the growth substrate in method step A).

For the mirror layer in method step C), a material may be used which comprises Ag as its main constituent. The mirror layer from method step C) may be applied for example by a method selected from: vapor deposition, sputtering, CVD, electroplating.

The mirror layer may be structured by a further method step, which falls between method steps C) and D), without the semiconductor layer being structured in the process. Structuring can be effected by means of one of the following methods: wet-chemical etching, plasma etching, a lift-off method. The structured mirror layer has the advantage that, when the component is in operation, current input is reduced or prevented completely at the areas at which the mirror layer has been removed. Current input may thus be purposefully prevented at the areas where shadowing elements such as conductor tracks or bond pads are present on the opposite side of the semiconductor layer, the outcoupling side.

For the diffusion barrier layer in method step G), a material may be used which comprises TiWN and/or TiN. The diffusion barrier layer may be applied for example by one of the following methods: sputtering, vapor deposition, CVD methods.

The passivation layer from method step E) may be built up from three sub-layers. The first sub-layer may for example assume a bonding function, the second a barrier function and the third and final layer the actual passivation function.

A material may be used for the carrier wafer which comprises Ge, Si or GaAs, AlN, SiN. Exemplary embodiments are possible in which the carrier wafer comprises an electrically conductive material, but embodiments are also conceivable in which the carrier wafer is not electrically conductive.

A material may be used for the contact layer of the carrier which comprises at least one of the elements Al, Pt, Au, Zn. The contact layer may be applied for example by one of the following methods: sputtering, vapor deposition.

A material may be used for the barrier layer of the carrier which comprises TiWN and/or TiN. The barrier layer may be applied for example by one of the following methods: sputtering, vapor deposition, CVD methods.

A material may be used for the bonding layer of the carrier which comprises Sn. Application of the layer sequence to the carrier in method step I) may be preceded by heating of the bonding layer.

The structured semiconductor layer may be roughened in a further method step J1). This method step takes place after method step F). Then, the roughened semiconductor layer may be provided with a top coat comprising a material which is transmissive for visible radiation, UV radiation, IR radiation or a combination of these radiations (method step J2)). Bisbenzocyclobutene (BCB) is suitable for such coating, for example. The top coat may be applied to the semiconductor layer for example by spin coating or spray coating. The use of bisbenzocyclobutene here results in good mesa trench edge filling. BCB additionally exhibits good radiation-stability.

A method variant is also possible in which the roughening of method step J1) may take place before method step F).

In a further method step J3), the top coat may be structured. Sub-regions of the semiconductor layer may be re-exposed thereby. An electrical contact may be applied to these exposed regions in a further method step J4).

A method is also possible in which the electrical contact is applied to the semiconductor layer prior to the top coat.

In addition to the method of producing the optoelectronic component, the invention also relates to the optoelectronic component itself.

One embodiment of the optoelectronic component comprises the following layer sequence: a structured semiconductor layer, a metallic mirror layer arranged thereon, a diffusion barrier layer arranged thereon, a passivation layer arranged thereon. The semiconductor layer here has a positive mesa edge at the flanks, that is, the mesa trenches taper from the free surface towards the mirror layer.

On operation of the optoelectronic component, an active zone is formed in the semiconductor layer, from which radiation is emitted. It is the object of the mirror layer to prevent the release of radiation into the component, such that all the radiation is emitted outwards via the upper side of the semiconductor layer. The diffusion barrier layer on the mirror layer is intended in particular when the component is in operation to prevent migration of the ions of the material from which the mirror layer has been made.

A further embodiment of the optoelectronic component comprises as further layers a carrier wafer, an electrical contact layer arranged on the carrier wafer, a barrier layer arranged on the contact layer and a bonding layer arranged on the barrier layer. The bonding layer is here joined to the passivation layer of the layer sequence described in the preceding paragraph.

BRIEF DESCRIPTION OF THE DRAWINGS

Variants of the invention are explained in greater detail below with reference to figures and exemplary embodiments.

FIG. 1a shows a conventional method and FIG. 1b shows a method according to an embodiment of the invention.

DETAILED DESCRIPTION OF THE DRAWINGS

Figure 2:
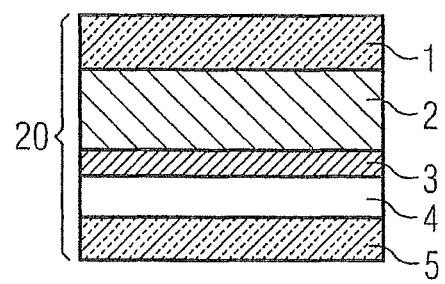
FIG. 2 shows a schematic side view of the layer sequence 20.

FIG. 1a shows a comparison of a conventional method compared with a variant of the method according to an embodiment of the invention shown in FIG. 1b. Both FIG. 1a and FIG. 1b show first of all a layer sequence consisting of growth substrate 1 and semiconductor layer 2. In both methods a metallic mirror layer 3 is firstly applied to the semiconductor layer 2. In the conventional method as illustrated in FIG. 1a, next, the metallic mirror layer 3 is structured with the assistance of a photo method and an etching method. This method step is dispensed with in the method according to the invention. In a next method step, a diffusion barrier layer 4 is applied to the metallic mirror layer 3. In the conventional methods as shown in FIG. 1a, the problem arises that the material of the diffusion barrier layer is then also present in the previously exposed region of the metallic mirror layer. In the conventional method of FIG. 1a, a further photo method and one or more etching steps are then performed. By means of the etching steps, the diffusion barrier layer 4 is structured, the region previously exposed in the metallic mirror layer 3 is etched free again, and the semiconductor layer 2 is structured. Etching proceeds in each case from the side remote from the growth substrate. These method steps are dispensed with in the method according to the invention shown in FIG. 1b. In a further method step, the passivation layer 5 is applied to the diffusion barrier layer 4. In the method illustrated in FIG. 1a, a further photo method and etching method are now additionally performed. The comparison makes it clear that in the conventional method as shown in FIG. 1a a markedly greater number of method steps is necessary. In particular, a plurality of photo and etching methods are needed here, whereas in the variant of the method according to the invention as illustrated in FIG. 1b not one photo and etching method has as yet been used. This constitutes a clear advantage over conventional technology. In a further method step, in the method according to the invention (FIG. 1b), the growth substrate 1 is now removed, which may proceed for example by means of laser lift-off, and thus a surface of the semiconductor layer 2 is exposed. The semiconductor layer 2 may now be structured from the exposed side by means of a single photolithographic step and a single etching step. In the etching step the mesa trench 12 with the mesa flanks 13 is etched.

The structure of the layer sequence as shown in FIG. 1b corresponds to method steps A) to C) and E) to H).

FIG. 2 shows a schematic side view of a layer sequence 20 produced by a variant of the method according to the invention. This comprises five layers with the layer sequence growth substrate 1, semiconductor layer 2, mirror layer 3, diffusion barrier layer 4, passivation layer 5. The structure of the layer sequence 20 as shown in FIG. 2 corresponds to method steps A) to C) and G) to H).

Figure 3:
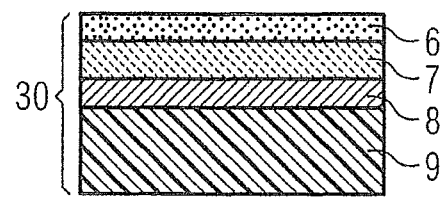
FIG. 3 shows a schematic side view of the layer sequence 30.

FIG. 3 shows a schematic side view of a layer sequence 30 produced by a variant of the method according to the invention, said sequence may for example be used as a carrier and be joined together with the layer sequence 20 shown in FIG. 2. This comprises a carrier wafer 9, a contact layer 8 arranged thereon, a barrier layer 7 arranged thereon, a bonding layer 6 arranged thereon. The bonding layer 6 here serves in subsequent joining of the layer sequence 30 to for example the layer sequence 20 as shown in FIG. 2. The layer sequence 30 may for example be produced by a method as described in method steps I1) to I4).

Figure 4:
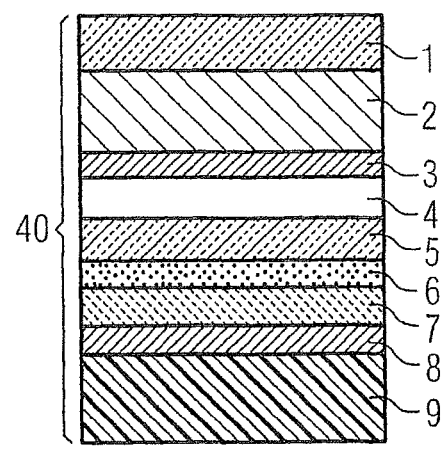
FIG. 4 shows a schematic side view of the layer sequence 40.

FIG. 4 shows a schematic side view of a layer sequence 40 produced by a variant of the method according to the invention. The layer sequence 40 results from joining together the layer sequences 20 and 30 as shown in FIG. 2 and FIG. 3, respectively. The layer sequences 20 and 30 are joined together by means of the adhesive material of the bonding layer 6. By joining together the layer sequences 20 and 30, the layers 2 to 5 of the layer sequence 20 are then additionally stabilized by the layer sequence 30, which ensures sufficient stability even after detachment of the growth substrate 1. Joining together of the layer sequences may be effected as described in method step I).

Figure 5:
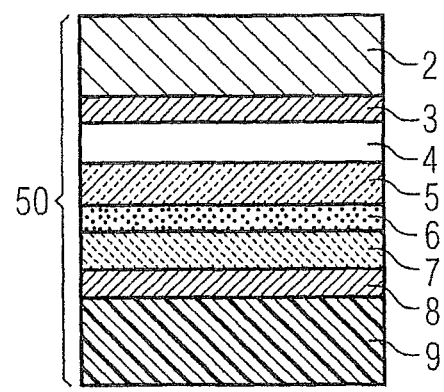
FIG. 5 shows a schematic side view of the layer sequence 50.

FIG. 5 shows a schematic side view of a layer sequence 50 produced by a variant of the method according to the invention. This results for example from a layer sequence 40 as shown in FIG. 4 by detaching the growth substrate 1. Detaching may be effected as described in method step E). This may be effected for example by laser lift-off. The layers 2, 3, 4, and 5 remaining from layer sequence 20 are then stabilized by layer sequence 30. A surface of the semiconductor layer 2 which was previously joined to the growth substrate 1 is now exposed again and may be structured from the exposed side.

Figure 6A:
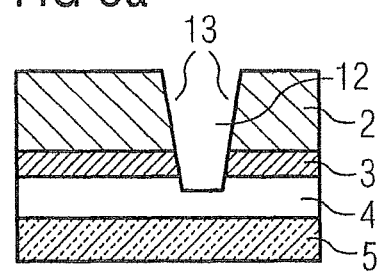
FIG. 6a shows a schematic side view of a layer sequence according to an embodiment of the invention with a mesa trench having a positive mesa edge.

FIG. 6a shows a schematic side view of a layer sequence, as it could be obtained for example from a layer sequence as illustrated in FIG. 2. For this purpose, the growth substrate 1 would have had to be detached in further method steps, as described in method step E), and the semiconductor layer 2 and the metallic mirror layer 3 would have had to be structured by means of an etching method, as described in method step F). FIG. 6a shows a mesa trench 12, having a positive mesa edge 13. Thus, the mesa trench 12 tapers into the semiconductor layer 2, that is, from the free surface which was hitherto joined to the growth substrate, in the direction of the layers following under the semiconductor layer 2, such as for example the metallic mirror layer 3.

Figure 6B:
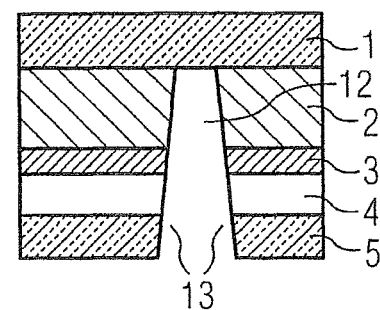
FIG. 6b shows a schematic side view of a layer sequence according to an embodiment of the invention with a mesa trench having a negative mesa edge.

FIG. 6b shows a schematic side view of a layer sequence produced by a method not according to the invention. The layer sequence has a mesa trench 12 but still comprises the growth substrate 1. The semiconductor layer 2 has here been etched from the side remote from the growth substrate. The mesa trench 12 has a negative mesa edge 13. Thus, after detachment of the growth substrate 1, the mesa trench 12 widens from the then exposed surface into the semiconductor layer. The further layers, metallic mirror layer 3, diffusion barrier layer 4 and passivation layer 5, have likewise been structured from the side remote from the growth substrate.

Figure 7:
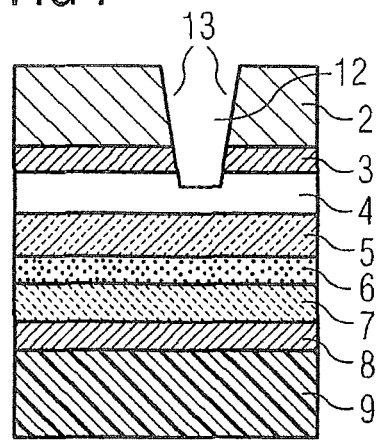
FIG. 7 shows a schematic side view of a structured layer sequence.

FIG. 7 shows a schematic side view of an embodiment of a structured layer sequence. Such an embodiment is obtained for example by structuring a layer sequence 50 as illustrated in FIG. 5. In FIG. 7, the semiconductor layer 2 and the mirror layer 3 are interrupted completely by the mesa trench 12 produced by the structuring. Here, the semiconductor layer 2 has a mesa trench 12 with positive mesa flank 13. The cross-section of the trench tapers from the surface hitherto joined to the growth substrate 1 towards mirror layer 3. The layer sequence illustrated in FIG. 7 can be obtained by means of a single photolithographic step or etching step.

Figure 8:
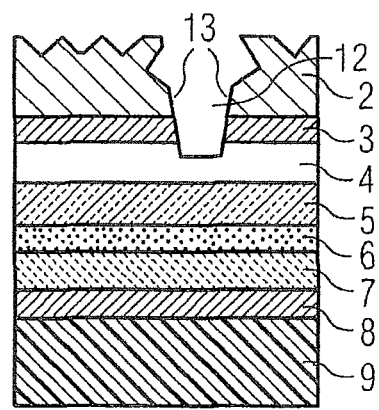
FIG. 8 shows a schematic side view of a structured layer sequence with additionally roughened surface.

FIG. 8 shows a schematic side view of an embodiment of a structured layer sequence, in which the surface has additionally also been roughened. Such a layer sequence is obtained for example from the layer sequence illustrated in FIG. 7. Structuring of the surface can be effected as described in method step J1).

Figure 9:
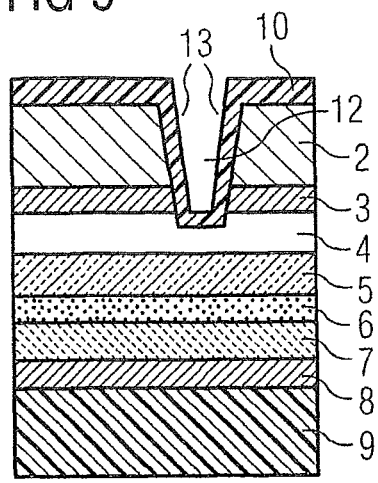
FIG. 9 shows a schematic side view of a structured layer sequence with coated surface.

FIG. 9 shows a schematic side view of an embodiment of a structured layer sequence, in which the surface has additionally been coated with a top coat 10. Such a layer sequence is obtained for example from the layer sequence illustrated in FIG. 8. Coating of the surface can be effected as described in method step J2). Bisbenzocyclobutene (BCB) is suitable for the top coat 10, for example. The top coat 10 passivates and protects the surface of the component.

Figure 10:
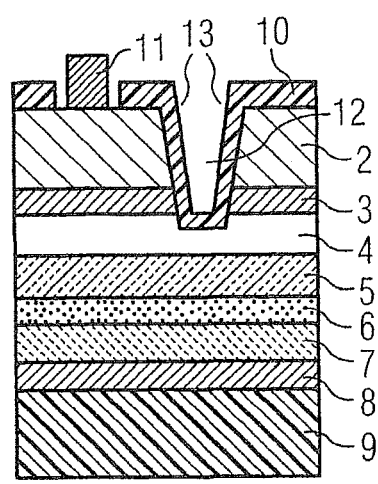
FIG. 10 shows a schematic side view of a structured layer sequence with contacted surface.

FIG. 10 shows a schematic side view of an embodiment of a structured layer sequence, in which the surface is additionally contacted with an electrical contact 11. Such a layer sequence is obtained for example from the layer sequence illustrated in FIG. 9. Contacting of the surface may be effected as described in method step J4), once the top coat 10 has been previously structured as described in method step J3).

Figure 11:
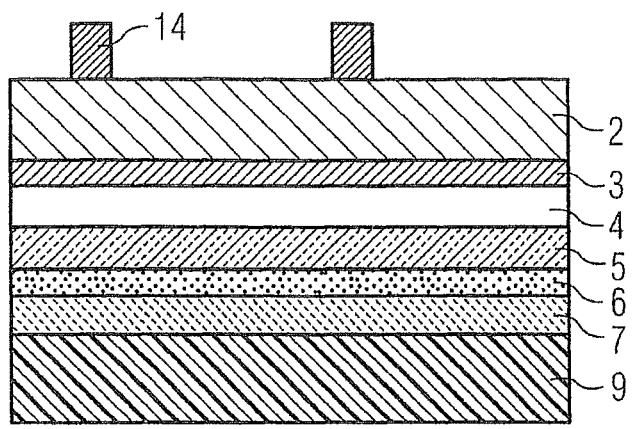
FIG. 11 shows a schematic side view of a layer sequence of a further embodiment.

FIG. 11 shows a schematic side view of an embodiment of a layer arrangement comprising the following layer sequence: a carrier wafer 9, a barrier layer 7, a bonding layer 6, a passivation layer 5, a diffusion barrier layer 4, a metallic mirror layer 3 and a semiconductor layer 2. Two first contacts 14 are additionally arranged on the semiconductor layer 2. The two first contacts 14 later serve for electrical contacting of the component with a first charge, which may be effected for example by way of a wire. Application of the first contacts takes place in method step D).

Figure 12:
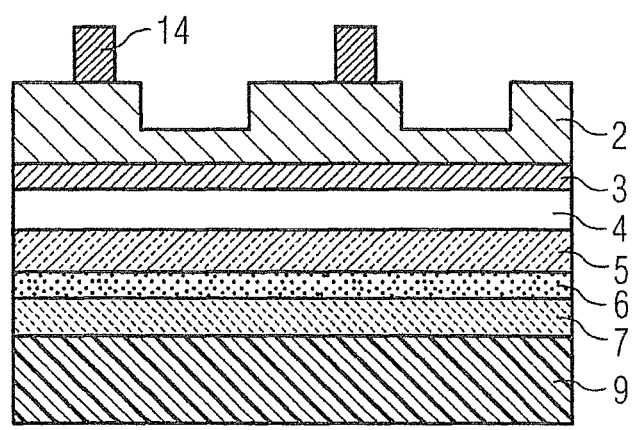
FIG. 12 shows a schematic side view of a layer sequence with structured semiconductor layer.

FIG. 12 shows a schematic side view of an embodiment of a layer arrangement as it could be obtained from the embodiment as illustrated in FIG. 11. Here, the semiconductor layer 2 has been structured in a further method step. The two first contacts 14 may be n-contacts, for example. Structuring of the semiconductor layer 2 has exposed a conductive layer of the semiconductor layer 2, in which, if the first contacts 14 are n-contacts, said layer is a p-layer. If the first contacts are p-contacts, the exposed layer would be an n-layer.

Figure 13:
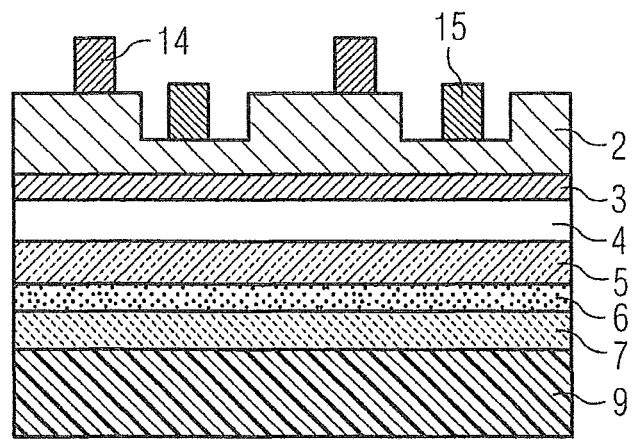
FIG. 13 shows a schematic side view of a layer sequence with two contacts.

FIG. 13 shows a schematic side view of an embodiment as could be obtained for example from the embodiment as illustrated in FIG. 12. The embodiment illustrated in FIG. 13 additionally comprises two second contacts 15, which are arranged on the layer which was exposed in the embodiment of FIG. 12. These two second contacts 15 may for example be p-contacts. Like the first contacts 14, they serve in subsequent electrical contacting of the component, but with the correspondingly opposite charge.

Figure 14:
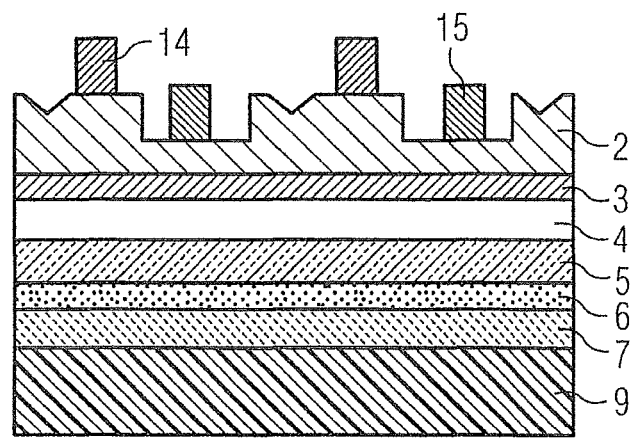
FIG. 14 shows a schematic side view of a layer sequence with roughened semiconductor layer.

FIG. 14 shows a schematic side view of an embodiment in which the surface of the semiconductor layer 2 has been roughened. This could be obtained from the embodiment as illustrated in FIG. 13. To this end, in a further method step, the surface of the semiconductor layer 2 was roughened. Roughening was effected according to method step J1).

Figure 15:
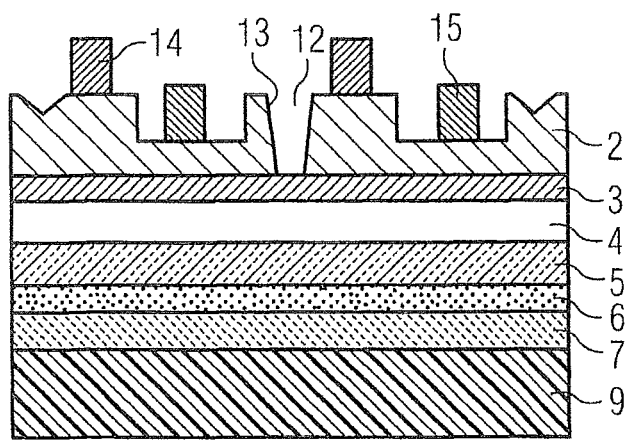
FIG. 15 shows a schematic side view of a layer sequence with mesa trench.

FIG. 15 shows a schematic side view of an embodiment with mesa trench 12 as could be obtained from the embodiment as illustrated in FIG. 14. FIG. 15 additionally has a mesa trench 12, which has been etched in the semiconductor layer 2 by means of an etching step. The etching step was effected from the free upper side, such that the mesa trench 12 comprises a positive mesa flank 13. Structuring of the semiconductor layer here proceeds according to method step F).

Figure 16:
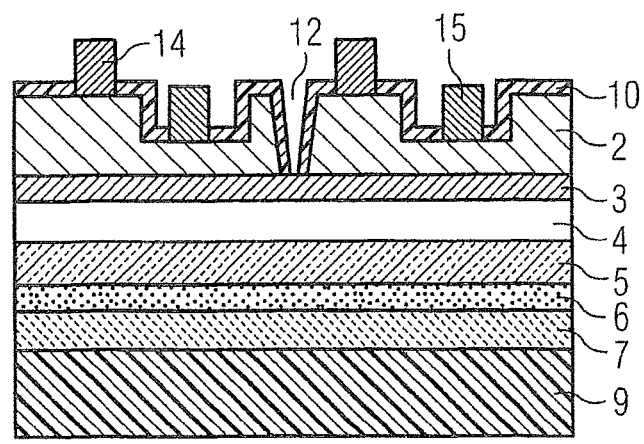
FIG. 16 shows a schematic side view of a layer sequence with top coat.

FIG. 16 shows a schematic side view of an embodiment with top coat 10. This could be obtained from the embodiment as illustrated in FIG. 15. To this end, the surface of the semiconductor layer 2 has been provided with a top coat 10 according to method step J2). The top coat 10 serves for passivation and protection of the semiconductor layer 2. The top coat 10 has been applied in such a way that the first and second contacts 14/15 are still free and have uncoated areas, such that electrical contacting is still possible.

Figure 17:
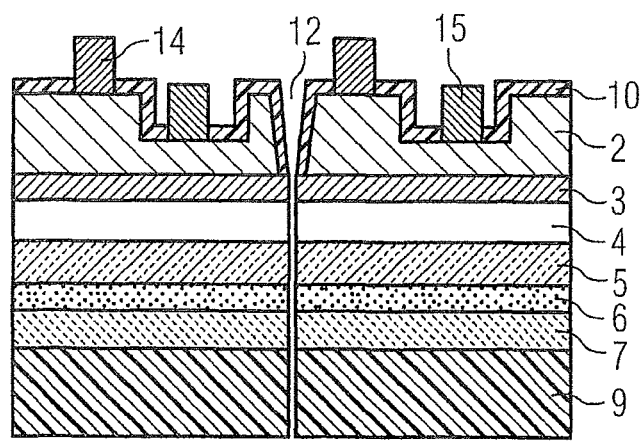
FIG. 17 shows a schematic side view of singulated components.

FIG. 17 is a schematic side view of an embodiment of singulated components. This could be obtained for example from the embodiment as illustrated in FIG. 16. In a further method step, the two components were singulated. To this end, a further etching process was for example carried out at the bottom of the mesa trench 12, by means of which all further layers have been cut through. Such cutting may be carried out for example by means of laser dicing.

Figure 18:
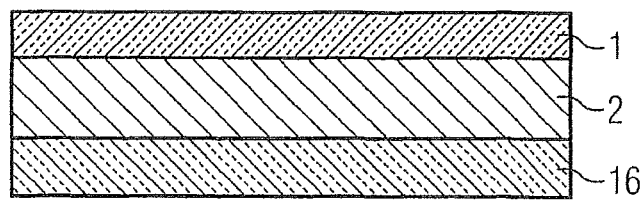
FIG. 18 shows a schematic side view of a layer sequence of a further embodiment with a low refractive dielectric.

FIG. 18 shows a schematic side view of a further embodiment. This embodiment comprises the layer sequence: a low refractive dielectric 16, a semiconductor layer 2 arranged thereon, a growth substrate 1 arranged thereon. The growth substrate 1 may for example be sapphire or silicon. GaInN may for example be used for the semiconductor layer 2. The semiconductor layer 2 may have been obtained by being grown according to method step B) on the growth substrate 1. $SiO_2$ may for example be used for the low refractive dielectric 16, which is a part of the mirror system.

Figure 19:
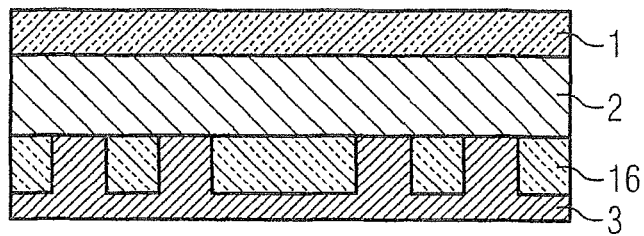
FIG. 19 shows a schematic side view of a layer sequence with a mirror system.

FIG. 19 shows a schematic side view of an embodiment as could be obtained for example from the embodiment as illustrated in FIG. 18. The embodiment illustrated in FIG. 19 additionally comprises a metallic mirror layer 3, which is arranged on the low refractive dielectric 16. Before applying the metallic mirror layer 3, which is effected according to method step C), sub-regions of the low refractive dielectric 16 were removed, such that the metallic mirror layer 3 penetrates the low refractive dielectric 16 in sub-regions. These sub-regions extend as far as the semiconductor layer 2. Ag may for example be used for metallic mirror layer 3. The combination of the low refractive dielectric 16 and the metallic mirror layer 3 together forms a mirror system.

Figure 20:
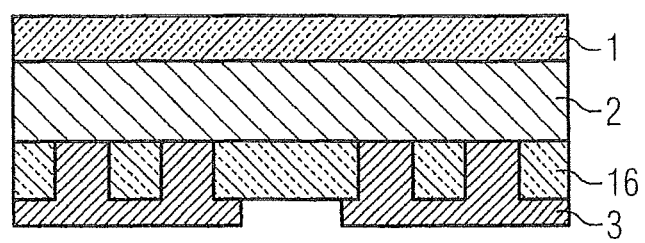
FIG. 20 shows a schematic side view of a layer sequence with a structured metallic mirror layer.

FIG. 20 shows a schematic side view of an embodiment with structured metallic mirror layer 3. This could be obtained from the embodiment as illustrated in FIG. 19. In the embodiment shown in FIG. 20, the metallic mirror layer 3 was structured. The structuring of the metallic mirror layer 3 exposed a sub-region of the low refractive dielectric 16.

Figure 21:
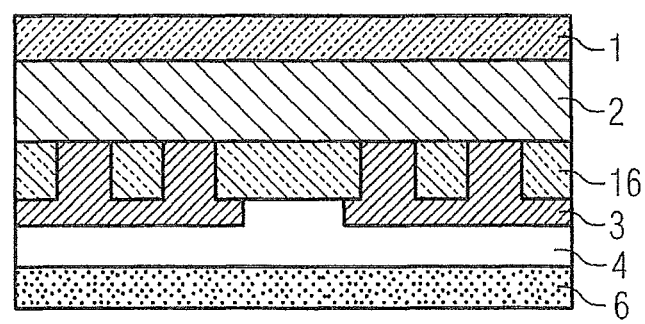
FIG. 21 shows a schematic side view of a layer sequence with a diffusion barrier layer.

FIG. 21 shows a schematic side view of an embodiment as it could be obtained for example from the embodiment as illustrated in FIG. 20. The embodiment illustrated in FIG. 21 additionally comprises a diffusion barrier layer 4, which is arranged on the metallic mirror layer 3. In the sub-region where the mirror layer was removed, the diffusion barrier layer 4 extends as far as the low refractive dielectric 16. Ti may for example be used for the diffusion barrier layer 4. Further, a bonding layer 6 is arranged on the diffusion barrier layer 4. Au may for example be used for the bonding layer 6. The bonding layer 6 serves later in joining of the layer sequence to further layers or layer sequences.

Figure 22:
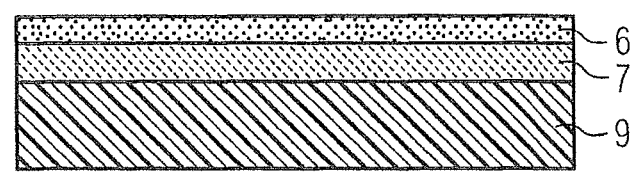
FIG. 22 shows a schematic side view of a layer sequence on a carrier wafer.

FIG. 22 shows a schematic side view of a further layer sequence. This layer sequence comprises a carrier wafer 9, a barrier layer 7 arranged thereon, a bonding layer 6 arranged thereon. The carrier wafer 9 can be made from an electrically conductive material such as for example silicon. The barrier layer 7 may serve inter alia to promote adhesion between the carrier wafer 9 and the bonding layer 6. Ti may for example be used for the barrier layer 7. A layer sequence of Au and Sn may for example be used for the bonding layer 6. Such a layer sequence may be obtained by method steps I1) to I3).

Figure 23:
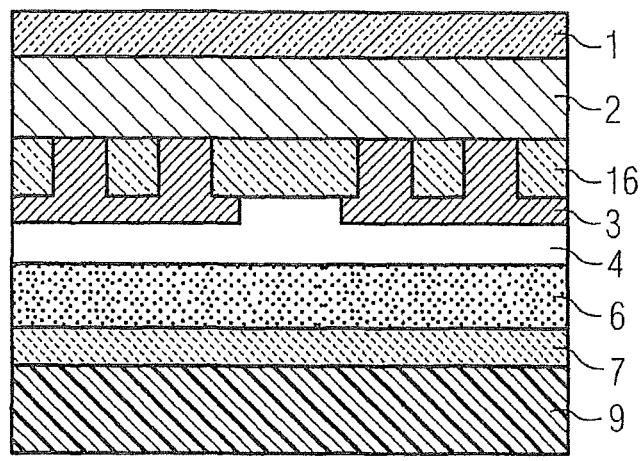
FIG. 23 shows a schematic side view of a layer sequence, resulting from the joining together of two layer sequences.

FIG. 23 shows a schematic side view of an embodiment as it is obtained for example from joining together the layer sequences as illustrated in FIGS. 21 and 22. To this end, the two layer sequences were joined together by way of their respective bonding layer 6.

Figure 24:
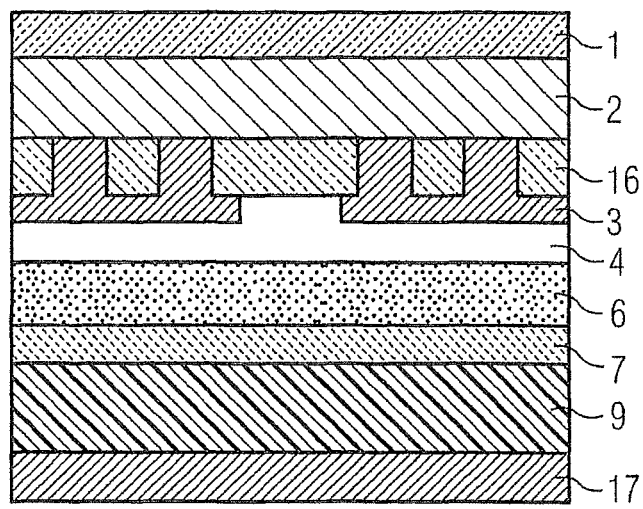
FIG. 24 shows a schematic side view of a layer sequence with back side contact.

FIG. 24 shows a schematic side view of an embodiment with a back side contact 17. This could be obtained for example from the embodiment as illustrated in FIG. 23. The embodiment illustrated in FIG. 24 additionally comprises a back side contact 17, which is arranged on the carrier wafer 9. The back side contact 17 may be used for electrical contacting of the component.

Figure 25:
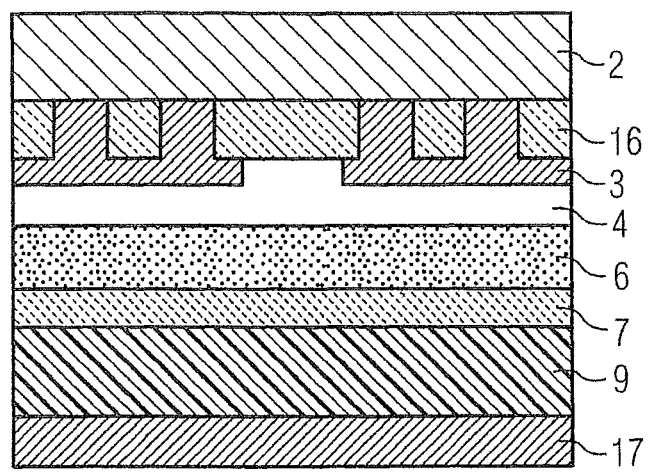
FIG. 25 shows a schematic side view of a layer sequence without growth substrate.

FIG. 25 shows a schematic side view of an embodiment as it could be obtained for example from the embodiment as illustrated in FIG. 24. To this end, the growth substrate 1 was removed from the semiconductor layer 2 as per method step C). This may be effected for example by means of laser lift-off.

Figure 26:
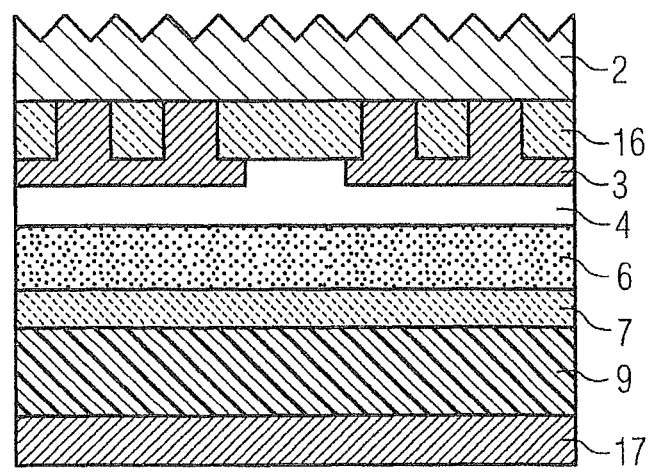
FIG. 26 shows a schematic side view of a layer sequence with roughened semiconductor layer.

FIG. 26 shows a schematic side view of an embodiment in which the surface of the semiconductor layer 2 has been roughened. This could be obtained for example from the embodiment as illustrated in FIG. 25. To this end, in a further method step, the surface of the semiconductor layer 2 was roughened. Roughening of the semiconductor layer may take place as in method step J1), except that here the semiconductor layer has not yet been structured.

Figure 27:
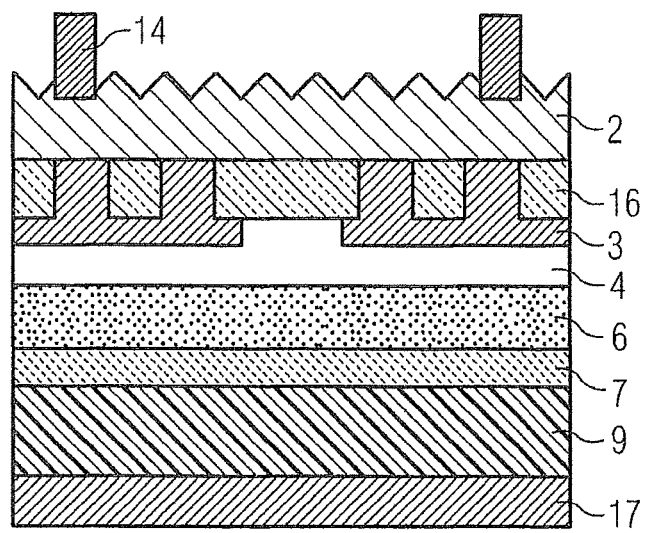
FIG. 27 shows a schematic side view of a layer sequence with first contacts.

FIG. 27 shows a schematic side view of an embodiment as it could be obtained for example from the embodiment as illustrated in FIG. 26. The embodiment illustrated in FIG. 27 additionally comprises two first contacts 14. The component may be electrically contacted by means of these first contacts 14. The component thus in each case has elements for electrical contacting both on the front and on the back.

Figure 28:
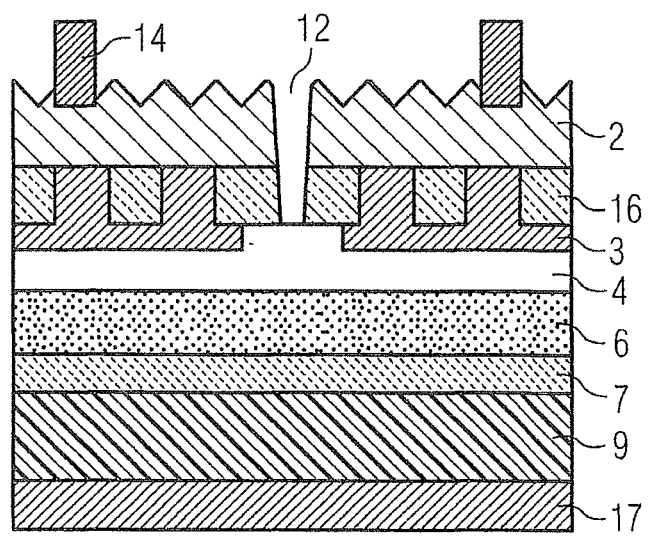
FIG. 28 shows a schematic side view of a layer sequence with mesa trench.

FIG. 28 shows a schematic side view of an embodiment with a mesa trench 12. This could be obtained for example from the embodiment as illustrated in FIG. 27. To this end, a mesa trench 12 was etched in a method step corresponding to method step F). The mesa trench 12 passes through the semiconductor layer 2 and the low refractive dielectric 16. The mesa trench 12 was etched from the side which was previously joined to the growth substrate 1. The mesa trench 12 thereby comprises a positive mesa flank. The mesa trench 12 was etched into the component in such a way that it meets the sub-region in which the metallic mirror layer 3 was previously removed, such that the mesa trench 12 ends at the diffusion barrier 4.

Figure 29:
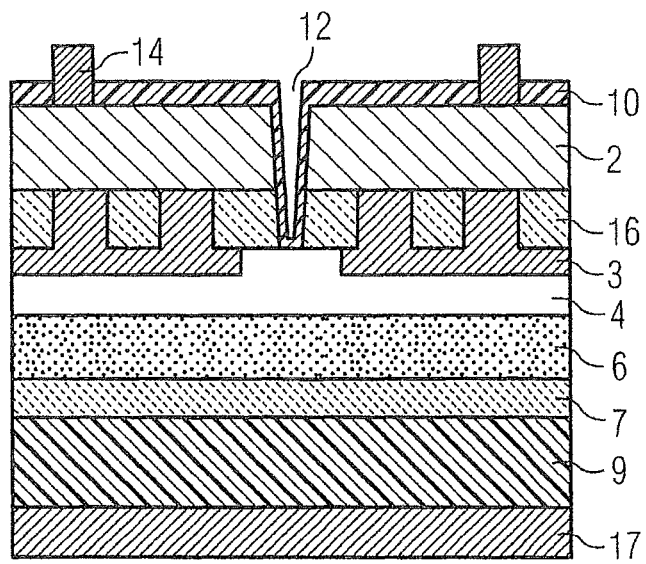
FIG. 29 shows a schematic side view of a layer sequence with top coat.

FIG. 29 shows a schematic side view of an embodiment as could be obtained for example from the embodiment as illustrated in FIG. 28. To this end, the surface of the component was provided with a top coat 10 according to method step J2). The top coat 10 also lines the side walls of the mesa trench 12, i.e. the mesa flanks. The top coat 10 serves in passivation and sealing of the component. The top coat 10 is applied to the surface of the component in such a way that the component can still be electrically contacted by way of the first contacts 14. These may however also initially be completely covered with the top coat 10, and sub-regions being exposed again in a further method step.

Figure 30:
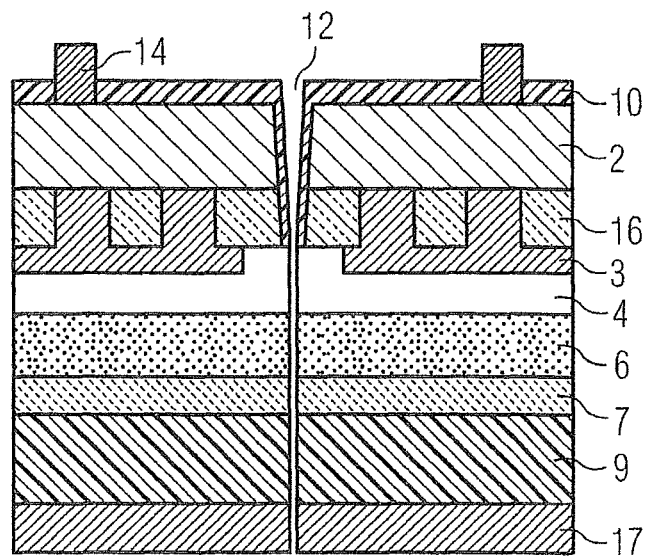
FIG. 30 shows a schematic side view of singulated components.

FIG. 30 shows a schematic side view of singulated components. These could be obtained for example from the embodiment as illustrated in FIG. 29. To this end, in a further method step, the two elements, previously joined together, were singulated. To this end, a further etching step was carried out for example at the bottom of the mesa trench 12, which cuts through the remaining layers. Such cutting may be carried out for example by means of laser dicing.

The invention is not restricted by the description given with reference to the exemplary embodiments. Rather, the invention comprises any novel feature and any combination of features, including in particular any combination of features in the claims, even if these features or this combination is not itself explicitly indicated in the claims or exemplary embodiments.

The invention claimed is:

1. An optoelectronic component, comprising:
    a structured semiconductor layer,
    a metallic mirror layer arranged on the semiconductor layer,
    a diffusion barrier layer arranged on the metallic mirror layer, and completely covering a side of the metallic mirror layer facing away from the semiconductor layer,
    a passivation layer arranged on the diffusion barrier layer, and completely covering a side of the diffusion barrier layer facing away from the semiconductor layer, and
    a structured low refractive dielectric arranged between the semiconductor layer and the metallic mirror layer;
    wherein the semiconductor layer comprises a mesa structure with mesa trenches, said mesa trenches taper from the surface of the semiconductor layer towards the mirror layer, and the mesa trenches penetrate the semiconductor layer completely;
    the metallic mirror layer penetrates the low refractive dielectric completely in first sub-regions such that the metallic mirror layer extends as far as the semiconductor layer in the first sub-regions;
    the diffusion barrier layer penetrates the metallic mirror layer in second sub-regions such that the diffusion barrier layer extends as far as the low refractive dielectric in the second sub-regions.

2. The optoelectronic component according to claim 1, comprising:
    a carrier wafer,
    an electrical contacting layer arranged on the carrier wafer,
    a barrier layer arranged on the contact layer,
    a bonding layer arranged on the barrier layer,
    wherein the bonding layer is joined to the passivation layer.

3. The optoelectronic component according to claim 1, wherein
    the metallic mirror layer is arranged on the semiconductor layer and the low refractive dielectric,
    the side of the metallic mirror layer facing the semiconductor layer comprises structures.

4. The optoelectronic component according to claim 1, wherein a sub-region of the metallic mirror layer is removed, so that the diffusion barrier layer extends as far as the low refractive dielectric.

5. The optoelectronic component according to claim 1, wherein the semiconductor layer comprises a positive mesa flank.

6. The optoelectronic component according to claim 1, wherein
    the structured semiconductor layer is roughened,
    the roughened semiconductor layer is coated with a top coat which is transmissive for visible radiation, UV radiation, IR radiation or a combination of these radiations.

7. The optoelectronic component according to claim 6, wherein the top coat is structured.

8. The optoelectronic component according to claim 7, wherein an electrical contact is arranged to a sub-region of the semiconductor layer, which is exposed by the structuring of the top coat.

9. An optoelectronic component, comprising:
a structured semiconductor layer;
a metallic mirror layer arranged on the semiconductor layer;
a structured low refractive dielectric arranged between the semiconductor layer and the metallic mirror layer;
a diffusion barrier layer arranged on a side of the metallic mirror layer facing away from the semiconductor layer and completely covering the side of the metallic mirror layer facing away from the semiconductor layer;
a passivation layer arranged on a side of the diffusion barrier layer facing away from the semiconductor layer and completely covering a side of the diffusion barrier layer facing away from the semiconductor layer;
a bonding layer arranged on a side of the passivation layer facing away from the semiconductor layer;
a carrier wafer arranged on a side of the bonding layer facing away from the semiconductor layer;
a barrier layer arranged between the bonding layer and the carrier wafer;
wherein
the metallic mirror layer penetrates the low refractive dielectric completely in first sub-regions such that the metallic mirror layer extends as far as the semiconductor layer in the first sub-regions,
the diffusion barrier layer penetrates the metallic mirror layer in second sub-regions completely such that the diffusion barrier layer extends as far as the low refractive dielectric in the second sub-regions,
the semiconductor layer comprises a mesa structure with mesa edges, the mesa edges penetrate the semiconductor layer and the low refractive dielectric completely,
in the second sub-regions the mesa edges extend as far as the diffusion barrier layer, the second sub-regions form a part of a side surface of the optoelectronic component, which extends transversely to a main extension plane of the semiconductor layer.

10. An optoelectronic component, comprising:
a structured semiconductor layer;
a metallic mirror layer arranged on the semiconductor layer;
a diffusion barrier layer arranged on the metallic mirror layer;
a passivation layer arranged on the diffusion barrier layer; and
a structured low refractive dielectric arranged between the semiconductor layer and the metallic mirror layer;
wherein the semiconductor layer comprises a mesa structure with mesa trenches, said mesa trenches taper from the surface of the semiconductor layer towards the mirror layer, and the mesa trenches penetrate the semiconductor layer completely;
the metallic mirror layer penetrates the low refractive dielectric completely in first subregions such that the metallic mirror layer extends as far as the semiconductor layer in the first sub-regions;
the diffusion barrier layer penetrates the metallic mirror layer in second sub-regions such that the diffusion barrier layer extends as far as the low refractive dielectric in the second sub-regions;
the passivation layer comprises three sub-layers, wherein the first sub-layer assumes a bonding function, the second sub-layer assumes a barrier function and the third sublayer assumes a passivation function.

* * * * *